(12) United States Patent
Asakawa

(10) Patent No.: US 7,018,926 B2
(45) Date of Patent: Mar. 28, 2006

(54) METHOD OF MANUFACTURING SEMICONDUCTOR DEVICE

(75) Inventor: Kazuhiko Asakawa, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 209 days.

(21) Appl. No.: 10/366,442

(22) Filed: Feb. 14, 2003

(65) Prior Publication Data

US 2003/0232502 A1    Dec. 18, 2003

(30) Foreign Application Priority Data

Jun. 14, 2002    (JP) .............................. 2002-173691

(51) Int. Cl.
*H01L 21/302*    (2006.01)
*H01L 21/461*    (2006.01)

(52) U.S. Cl. ................... 438/692; 438/706; 438/745

(58) Field of Classification Search ................ 438/692, 438/706, 745
See application file for complete search history.

(56) References Cited

U.S. PATENT DOCUMENTS

| | | | |
|---|---|---|---|
| 5,266,824 A * | 11/1993 | Abe et al. ................... | 257/347 |
| 5,624,299 A | 4/1997 | Shendon ....................... | 451/28 |
| 5,926,713 A | 7/1999 | Hause et al. ................. | 438/296 |
| 6,030,425 A | 2/2000 | Hata ............................ | 51/309 |
| 6,117,778 A * | 9/2000 | Jones et al. .................. | 438/692 |

FOREIGN PATENT DOCUMENTS

| | | |
|---|---|---|
| JP | 03-085732 | 4/1991 |
| JP | 05-062951 | 3/1993 |
| JP | 05-181161 | 7/1993 |
| JP | 08-213390 | 8/1996 |
| JP | 09-323261 | 12/1997 |
| JP | 11-162896 | 6/1999 |
| JP | 11-168040 | 6/1999 |
| JP | 2000-021882 | 1/2000 |
| JP | 2001-338852 | 12/2001 |

OTHER PUBLICATIONS

Takafumi et al., Semiconductor Wafer with Step and Curved Surface in End Part and Its Working Method, Computer Generate English translation of JP 2001-338852, 8 pages.*

* cited by examiner

*Primary Examiner*—Nadine G. Norton
*Assistant Examiner*—Lynette T. Umez-Eronini
(74) *Attorney, Agent, or Firm*—Rabin & Berdo, PC

(57) ABSTRACT

A method of manufacturing a semiconductor device includes a providing step and a polishing step. In the providing step, a semiconductor wafer is provided. The semiconductor wafer has a plane area including a plane surface and a peripheral area surrounding the plane area. The peripheral area has a hemispherical surface extending from the plane surface to a wafer end. The distance from an end of the plane surface to the wafer end is about 800–1000 μm. In the polishing step, mechanically and chemically polishing is conducted using a polishing pad with a polishing slurry.

10 Claims, 5 Drawing Sheets

METHOD OF MANUFACTURING SEMICONDUCTOR DEVICE

BACKGROUND OF THE INVENTION

The present invention relates to a method of manufacturing a semiconductor device, and specifically to a method of manufacturing an LSI device having a CMP process.

FIG. 3 is a partly cross-sectional view of a wafer short in ROS (Roll off starting point: length from a wafer plane end to a wafer end), which has a conventional CVD oxide film deposited thereon, and FIG. 4 is a diagram showing a wafer in-plane distribution of a polishing rate where CMP is effected on the wafer.

In FIG. 3, reference numeral 1 indicates a wafer, reference numeral 2 indicates a plane area of the wafer, reference numeral 3 indicates a wafer plane end, reference numeral 4 indicates a wafer end, and reference numeral 5 indicates a ROS thereof, respectively.

It is understood in the examples shown in FIGS. 3 and 4 that a distribution of a polishing rate has a characteristic in which the polishing rate is high at each wafer edge portion. In conclusion, the prior art shows that the polishing rate is not uniform within a wafer plane. It is desirable that in-plane uniformity of a polishing rate is satisfactory as the ideal. When a CMP process is actually effected on a device under circumstances where the uniformity is low, a problem arises in that the residual thickness of a polished film after having been polished, becomes ununiform.

Beside, FIG. 4 illustrates a wafer in-plane distribution of a polishing rate where polishing pads different in hardness are used. It is understood that the in-plane uniformity of the polishing rate is poor at a hard pad (indicated by a broken line in FIG. 4) as compared with a soft polishing pad (indicated by a solid line in FIG. 4) commonly used at present. It has become apparent that the hard pad is effective to improve flatness of the interior of a device chip. However, since the degradation of the wafer in-plane uniformity of the polishing rate becomes a problem, there is a need to improve the uniformity as common as the conventional soft pad.

As one cause that degrades the wafer in-plane uniformity of the polishing rate, deficiency in supply of a polishing slurry to the whole plane of the wafer has been estimated.

As shown in FIG. 3, a conventional sectional shape of a wafer end has a flat surface or plane up to about 0.7 mm (700 μm) as viewed from the wafer end with the object of ensuring a plane in the wafer surface to the utmost. The wafer has a hemispherical surface extending from the wafer plane end 3 to the wafer end 4.

Since the length (ROS) from the wafer plane end 3 to the wafer end 4 is small, the angle of contact between the wafer polishing pads becomes large, thus causing a phenomenon that the polishing slurry intended to flow toward the center of the wafer is dammed up. Therefore, a problem arises in that the deficiency in supply of the polishing slurry occurs.

SUMMARY OF THE INVENTION

The present invention may provide a method of manufacturing a semiconductor device, which reduces the angle of contact between wafer polishing pads and improves uniformity of a CMP polishing rate to thereby make it possible to resolve deficiency in supply of a polishing slurry.

In order to achieve the above object, the present invention provides a method of manufacturing a semiconductor device, comprising the steps of, as specs for wafer edge shapes, using a wafer wherein the length of a spherical shape extending from a wafer plane end to a wafer end is set so as to range from 800 μm to 1000 μm, reducing the angle of contact between wafer polishing pads upon CMP polishing, and improving wafer in-plane uniformity of a CMP polishing rate.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings.

Figure 1:
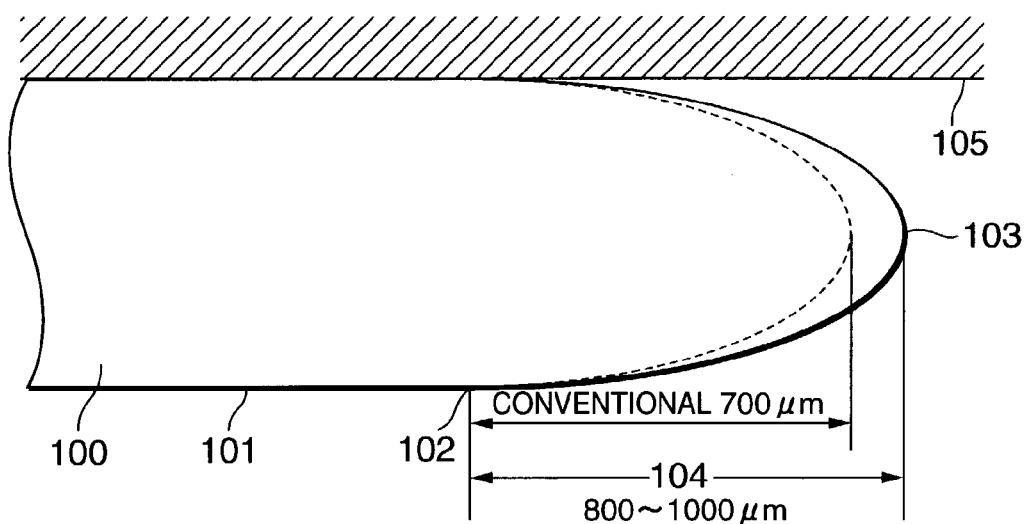
FIG. 1 is a diagram showing the manner of polishing of a wafer long in ROS, which is illustrative of a first embodiment of the present invention.
Figure 2:
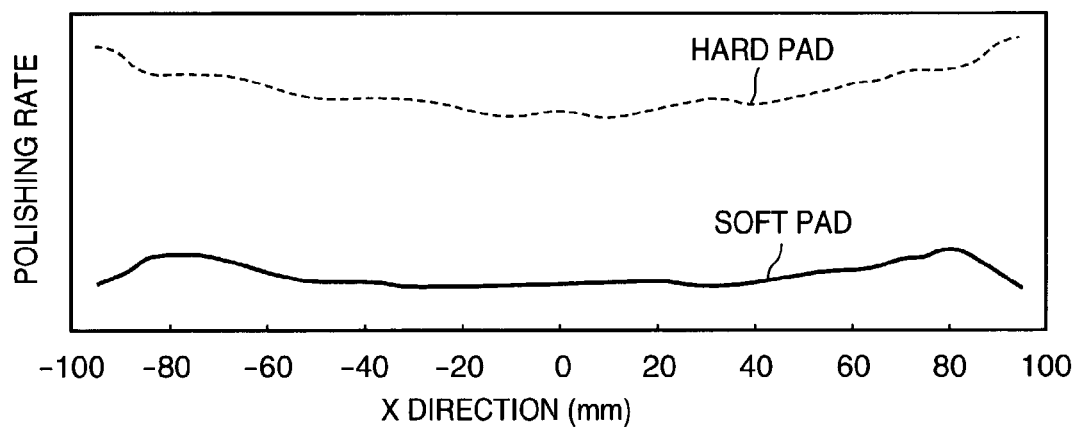
FIG. 2 is a diagram illustrating a wafer in-plane distribution of a polishing rate when CMP is effected on the wafer long in ROS, which shows the first embodiment of the present invention.
Figure 3:
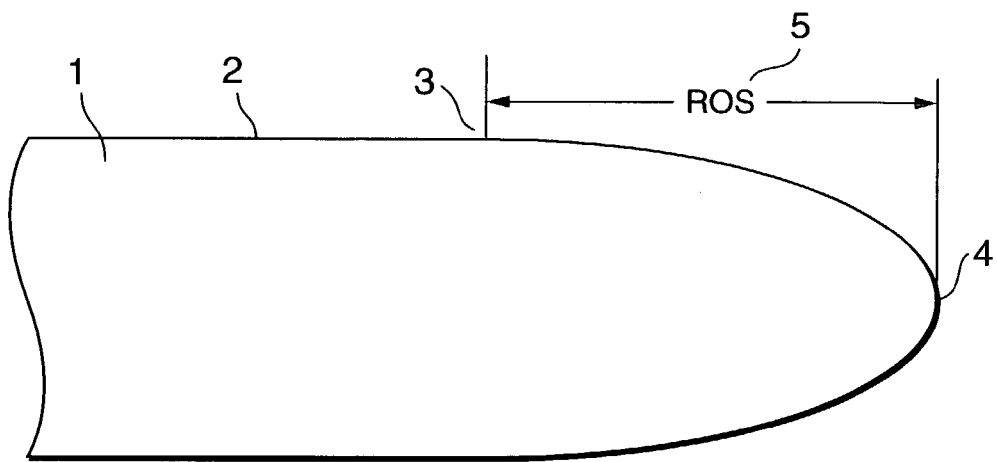
FIG. 3 is a partly cross-sectional view of a conventional wafer short in ROS, on which a CVD oxide film is deposited.

FIG. 1 is a diagram showing the manner of polishing of a wafer long in ROS, which shows a first embodiment of the present invention, and FIG. 2 is a diagram illustrating a wafer in-plane distribution of a polishing rate where CMP is effected on the wafer long in ROS, which shows the first embodiment of the present invention, respectively.

In FIG. 1, reference numeral 100 indicates a wafer, reference numeral 101 indicates a plane area (effective chip area) of the wafer, reference numeral 102 indicates a wafer plane end, reference numeral 103 indicates a wafer end, reference numeral 104 indicates ROS (which corresponds to a length from the plane end to the wafer end, and ranges from 800 μm to 1000 μm herein), and reference numeral 105 indicates a polishing pad, respectively.

In the present embodiment, the ROS 104 is made long as 800 μm, for example, as specs for wafer edge shapes. Namely, the ROS 104 is made longer than the conventional ROS of 700 μm, i.e., it is set so as to range from 800 μm to 1000 μm, and improved so that the angle of contact between the wafer and the polishing pads is reduced. CMP is executed using such a wafer.

Since the first embodiment is configured in this way, the following advantageous effects can be brought about.

Since the contact angle between the wafer and the polishing pads is small in the present embodiment, deficiency in supply of a polishing slurry to the whole plane of the wafer is improved. It is therefore possible to improve wafer in-plane uniformity of the polishing rate.

Figure 4:
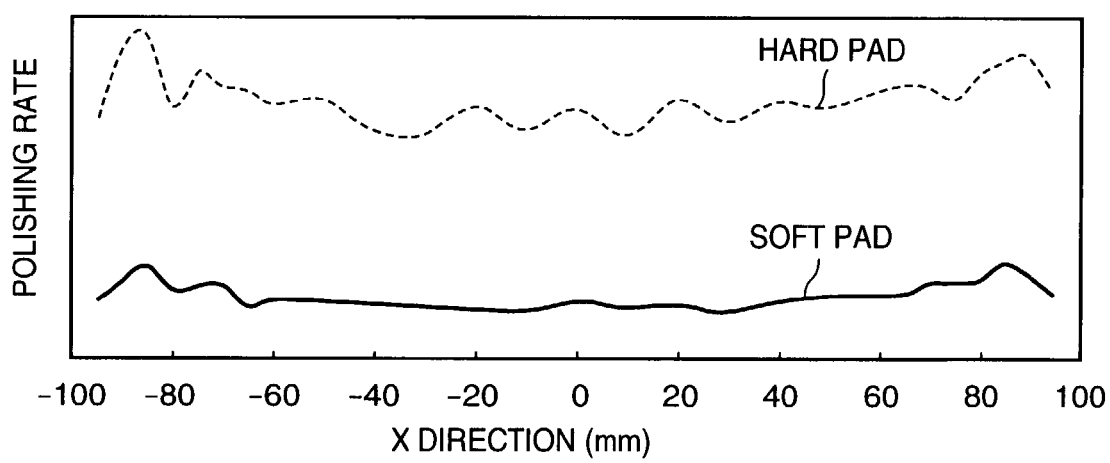
FIG. 4 is a diagram showing a wafer in-plane distribution of a polishing rate when CMP is effected on the conventional wafer.

It is understood that as is apparent from the contrast between the polishing-rate distribution map of the wafer long in ROS, showing the first embodiment of the present invention shown in FIG. 1 and the polishing-rate distribution map of the conventional wafer short in ROS, which is shown in FIG. 4, the wafer according to the embodiment of the present invention, which has such specs that ROS becomes long, is better in uniformity than the conventional wafer having such specs that ROS becomes short as a result of investigations of in-plane distributions of polishing rates at both hard and soft pads. It is understood that the effect of improving wafer in-plane uniformity is further increased in the case of the hard pad (dotted line) in particular.

A second embodiment of the present invention will next be described.

Figure 5:
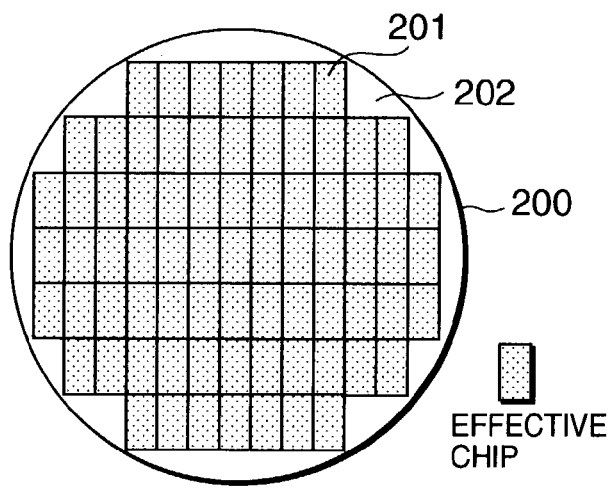
FIGS. 5(a) and 5(b) are respectively overall plan views of a wafer showing a second embodiment of the present invention.
Figure 5:
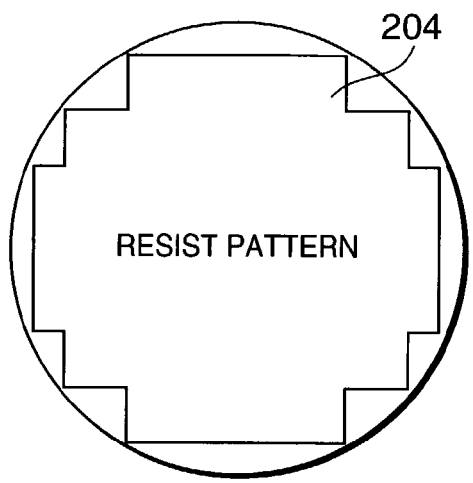
Figure 6:
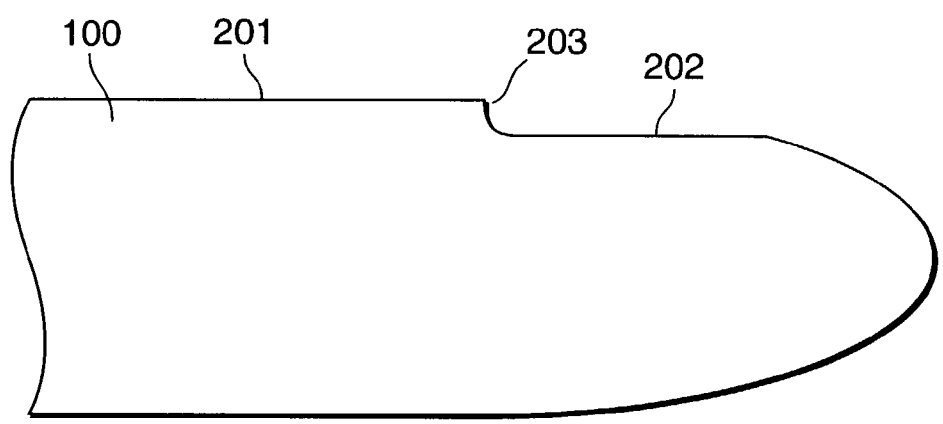
FIG. 6 is a fragmentary cross-sectional view of the wafer showing the second embodiment of the present invention.

FIG. 5 is an overall plan view of a wafer showing the second embodiment of the present invention, wherein FIG. 5(a) is a plan view illustrating an effective chip area of the wafer, and FIG. 5(b) is a plan view showing a resist pattern for the effective chip area of the wafer, respectively. FIG. 6 is a fragmentary cross-sectional view of the wafer.

In the present embodiment, a resist pattern 204 is formed on an effective chip area 201 of a wafer 200 shown in FIG. 5(a) as shown in FIG. 5(b). Afterwards, the process of using a dry or wet etching technology in a resist-free chip unused area 202 to thereby form a step 203 (see FIG. 6) between the surface of the effective chip area 201 of the wafer 200 and the chip unused area 202 is executed. A CMP process is executed using the wafer of such a structure as to have the step 203.

Since the second embodiment is configured in this way, the following advantageous effects can be brought about.

Owing to the provision of the step 203 between the effective chip area 201 of the wafer 200 and the chip unused area 202, wraparound of the polishing slurry in the effective chip area 201 is improved as compared with the conventional step-free structure. Therefore, the wafer in-plane uniformity of the CMP polishing rate is improved, and an improvement in residual film-thickness uniformity subsequent to wafer polishing can be expected.

A third embodiment of the present invention will next be described.

Figure 7:
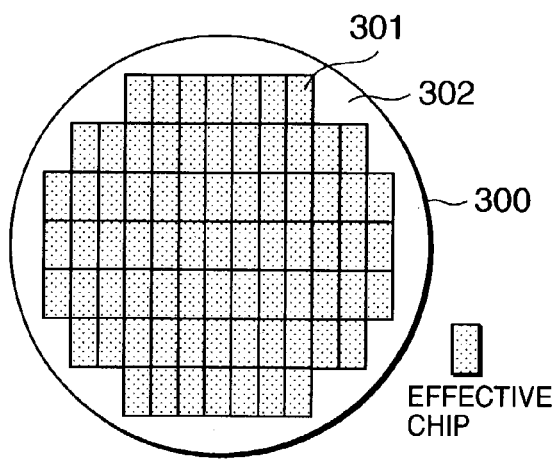
FIGS. 7(a) and 7(b) are respectively overall plan views of a wafer showing a third embodiment of the present invention.
Figure 7:
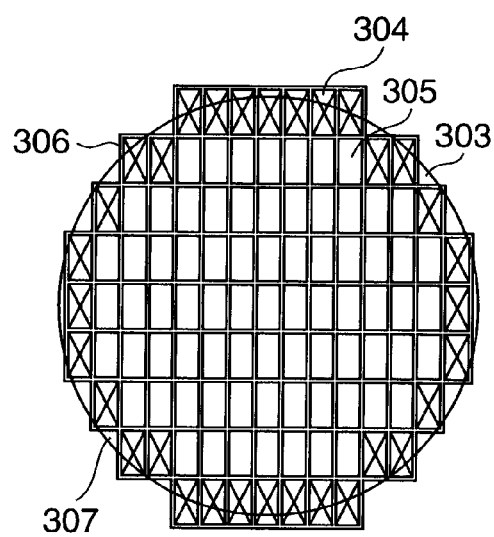
Figure 8:
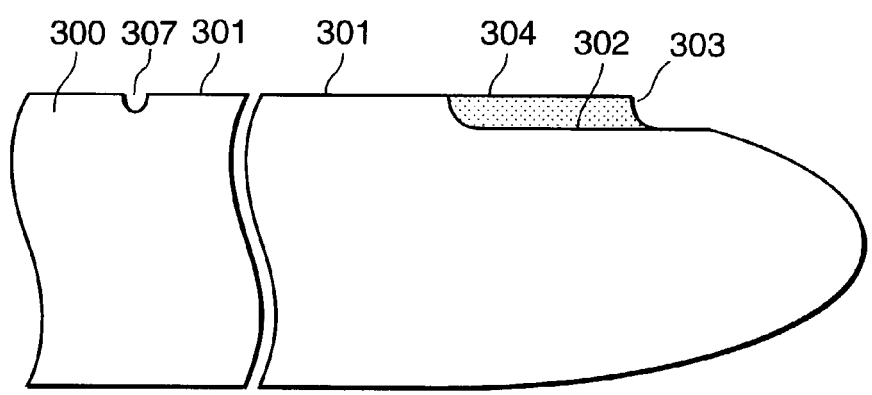
FIG. 8 is a fragmentary cross-sectional view of the wafer illustrating the third embodiment of the present invention.

FIG. 7 is an overall plan view of a wafer showing the third embodiment of the present invention, wherein FIG. 7(a) is a plan view showing an effective chip area of the wafer, and FIG. 7(b) is a plan view of the wafer, showing a state of addition of dummy chips thereto, respectively. FIG. 8 is a fragmentary cross-sectional view of the wafer.

In the present embodiment, resist patterns 305 each having a size identical to a chip size are respectively formed on chips in an effective chip area 301 on a wafer 300. At this time, resist patterns each having a size identical to the chip size are formed in an unused area 302 adjacent to the effective chip area 301 as dummy chips 304 in the same arrangements as shown in FIG. 7(b).

Afterwards, the process of using a dry or wet etching technology in a resist-free chip unused area 307 and grid lines 306 and thereby forming a step 303 between the plane of the effective chip area 301 and an area in which the dummy chips 304 are placed, and the resist-free chip unused area 307 is executed. A CMP process is executed using the wafer of a structure having the step 303.

Since the third embodiment is configured in this way, the following advantageous effects can be brought above.

Since the resist patterns each having the size identical to the chip size are formed as the dummy chips 304 in the same arrangements in the unused area 302 adjacent to the effective chip area 301, no step is formed between the effective chip area and the unused area, and a polishing rate stable in all the chips can be expected.

Owing to the provision of the step 303 in the resist-free wafer unused area 307, wraparound of a polishing slurry in the effective chip area 301 can be improved as compared with the step-free structure in the prior art. Incidentally, since the step 303 is formed at each grid line 306, the polishing slurry can be fed inside the step 303.

Thus, in-plane uniformity of the CMP polishing rate can be further improved as compared with the second embodiment, and an improvement in residual film-thickness uniformity subsequent to wafer polishing can be expected. In the second embodiment, there is fear that the polishing rate will rise as intended for the effective chips in the neighborhood of the wafer edge. In the third embodiment, however, the dummy chips are disposed in the unused area adjacent to the effective chips, and no step is formed between the effective chip area and the unused area. Therefore, the polishing rate stable in all the effective chips can be expected.

A fourth embodiment of the present invention will next be described.

Figure 9:
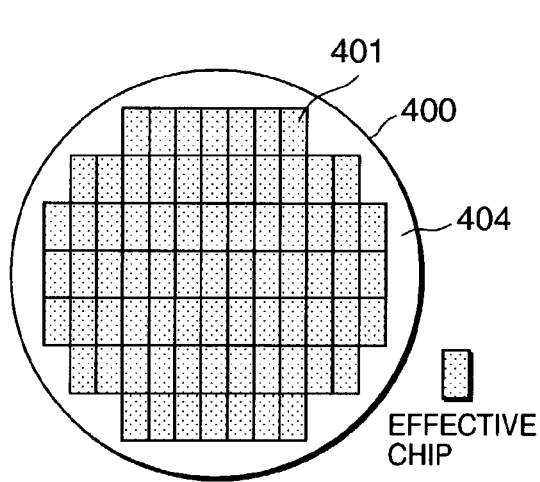
FIGS. 9(a) and 9(b) are respectively overall plan views of a wafer showing a fourth embodiment of the present invention.
Figure 9:
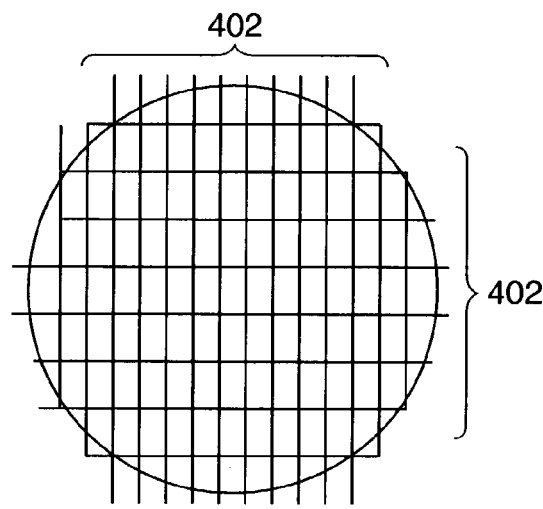
Figure 10:
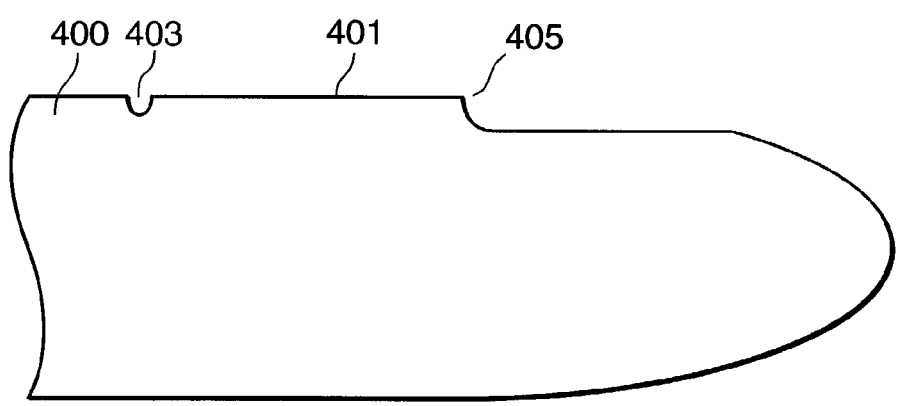
FIG. 10 is a fragmentary cross-sectional view of the wafer illustrating the fourth embodiment of the present invention.

FIG. 9 is an overall plan view of a wafer showing the fourth embodiment of the present invention, wherein FIG. 9(a) is a plan view showing an effective chip area of the wafer, and FIG. 9(b) is a plan view of the wafer having grid lines, respectively. FIG. 10 is a fragmentary cross-sectional view of the wafer.

In the present embodiment, dicing is effected on grid lines 402 existing among effective chip areas 401 on a wafer 400 with a trench depth set as several tens of μm to thereby define trenches 403 in the grid lines 402. A CMP process is executed using the wafer having a structure with the trenches 403.

Since the fourth embodiment is constructed in this way, the following advantageous effects can be brought about.

Owing to the provision of a step 405 between the effective chip area 401 of the wafer 400 and a chip unused area 404, wraparound of a polishing slurry in the effective chip area 41 can be improved as compared with the step-free structure in the prior art. Further, since the trenches 403 are defined even in the grid lines 402 by the execution of dicing, the polishing slurry can be fed inside the trenches 403. Since a photolitho process can be reduced as compared with the third embodiment, a reduction in cost can be expected.

Since the dicing is used to define the trenches 403, the deep trenches can be defined in a short period of time as compared with etching. Since the deeper the trenches 403, the greater the rate of flow of the polishing slurry into the trenches 403, a further improvement in wafer in-plane uniformity of a CMP polishing rate is eventually achieved and an improvement in residual film-thickness uniformity subsequent to wafer polishing can be expected.

Incidentally, the present invention is not limited to the above embodiments, and various modifications can be made thereto on the basis of the sprit of the present invention. They will not be eliminated from the scope of the present invention.

According to the present invention as described above in detail, the following advantageous effects can be brought about.

Since the angle of contact between wafer polishing pads is small, deficiency in supply of a polishing slurry to the whole plane of a wafer is improved. It is therefore possible to improve wafer in-plane uniformity of a polishing rate.

Owing to the provision of a step between an effective chip area of a wafer and a chip unused area, wraparound of a polishing slurry in the effective chip area is improved as compared with a conventional step-free structure. Therefore, an improvement in wafer in-plane uniformity of a CMP polishing rate is achieved, and an improvement in residual film-thickness uniformity subsequent to wafer polishing can be expected.

Since resist patterns each having a size identical to a chip size are formed in the same arrangements as dummy chips in an unused area adjacent to an effective chip area of a wafer, no step is formed between the effective chip area and the chip unused area, and a polishing rate stable in all the chips can be expected.

Owing to the provision of a step in an unused area of a resist-free wafer, wraparound of a polishing slurry in an effective chip area can be improved as compared with the step-free structure of the prior art.

Owing to the provision of a step between an effective chip area of a wafer and a chip unused area, wraparound of a polishing slurry in the effective chip area can be improved as compared with the step-free structure of the prior art. Further, since trenches are defined even in grid lines by execution of dicing, a polishing slurry can be fed inside the trenches.

What is claimed is:

1. A method of manufacturing a semiconductor chip comprising:
    providing a semiconductor wafer having a plane area having a plane surface and a peripheral area surrounding the plane area and having a hemispherical surface extending from the plane surface to a wafer end;
    forming a plurality of resist patterns each having a size equal to the semiconductor chip on the plane area except a grid line portion and a part of the peripheral area;
    removing the hemispherical surface of a remaining part of the peripheral area and the plane surface of the grid line portion so that a step is formed at the remaining part of the peripheral area and the grid line portion; and
    mechanically and chemically polishing the wafer using a polishing pad with a polishing slurry.

2. The method of manufacturing a semiconductor chip according to claim 1, wherein the removing step is performed by a wet etching process.

3. The method of manufacturing a semiconductor chip according to claim 1, wherein the removing step is performed by a dry etching process.

4. The method of manufacturing a semiconductor chip according to claim 1, wherein the polishing slurry is supplied to the whole plane of the wafer.

5. The method of manufacturing a semiconductor chip according to claim 1, wherein the polishing slurry is fed inside the step at the grid line portion during the polishing step.

6. A method of manufacturing a semiconductor chip comprising:
    providing a semiconductor wafer having a plane area having a plane surface and a peripheral area surrounding the plane area and having a hemispherical surface extending from the plane surface to a wafer end;
    removing a part of the hemispherical surface extending from the plane surface and a grid line portion of the plane area so that a step between the plane surface and the removed surface of the hemispherical surface and within the grid line portion is formed; and
    mechanically and chemically polishing the wafer using a polishing pad with a polishing slurry.

7. The method of manufacturing a semiconductor chip according to claim 6, wherein the removing step is performed by a wet etching process.

8. The method of manufacturing a semiconductor chip according to claim 6, wherein the removing step is performed by a dry etching process.

9. The method of manufacturing a semiconductor chip according to claim 6, wherein the polishing slurry is supplied to the whole plane of the wafer.

10. The method of manufacturing a semiconductor chip according to claim 6, wherein the polishing slurry is fed inside the step at the grid line portion during the polishing step.

* * * * *